(12) United States Patent
Chishti et al.

(10) Patent No.: US 9,001,608 B1
(45) Date of Patent: Apr. 7, 2015

(54) COORDINATING POWER MODE SWITCHING AND REFRESH OPERATIONS IN A MEMORY DEVICE

(71) Applicants: Zeshan A. Chishti, Hillsboro, OR (US); Ishwar Bhati, College Park, MD (US)

(72) Inventors: Zeshan A. Chishti, Hillsboro, OR (US); Ishwar Bhati, College Park, MD (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/099,621

(22) Filed: Dec. 6, 2013

(51) Int. Cl.
*G11C 7/00* (2006.01)
*G11C 11/406* (2006.01)

(52) U.S. Cl.
CPC .................................. *G11C 11/406* (2013.01)

(58) Field of Classification Search
CPC . G11C 11/406; G11C 11/24; G11C 11/40615
USPC ............. 365/222, 149, 185.25, 226, 227, 229
See application file for complete search history.

(56) References Cited

U.S. PATENT DOCUMENTS

| | | | | |
|---|---|---|---|---|
| 5,262,998 | A * | 11/1993 | Mnich et al. ................... | 365/222 |
| 7,768,857 | B2 * | 8/2010 | Ruckerbauer .................. | 365/222 |
| 8,400,859 | B2 * | 3/2013 | Pelley et al. ................... | 365/222 |

OTHER PUBLICATIONS

Amin, A.M., and Z.A. Chishti, "Rank-Aware Cache Replacement and Write Buffering to Improve DRAM Energy Efficiency", Proceedings of the 16th ACM/IEEE International Symposium on Low Power Electronics and Design, 2010, 6 pp.

Bi, M., R. Duan, and C. Gniady, "Delay-Hiding Energy Management Mechanisms for DRAM", Proceedings of the 16th IEEE International Symposium on High Performance Computer Architecture (HPCA), 2010, 10 pp.

Delaluz, V., M. Kandemir, N. Vijaykrishnan, A. Sivasubramaniam, and M.J. Irwin, "DRAM Energy Management Using Software and Hardware Directed Power Mode Control", Proceedings of the 7th International Symposium on High Performance Computer Architecture, 2001, 11 pp.

Delaluz, V., A. Sivasubramaniam, M. Kandemir, N. Vijaykrishnan and M.J. Irwin, "Scheduler-Based DRAM Energy Management", Proceedings of the 39th Annual Design Automation Conference, 2002, 6 pp.

Diniz, B., D. Guedes, W. Meira, Jr., and R. Bianchini, "Limiting the Power Consumption of Main Memory", Proceedings of the 34th Annual International Symposium on Computer Architecture, 2007, 12 pp.

Fan, X., C.S. Ellis, and A.R. LeBeck, "Memory Controller Policies for DRAM Power Management", Proceedings of the 2001 International Symposium on Low Power Electronics and Design, 2001, 6 pp.

(Continued)

*Primary Examiner* — Tan T. Nguyen
(74) *Attorney, Agent, or Firm* — Konrad Raynes Davda & Victor LLP; David W. Victor

(57) ABSTRACT

Provided are a memory system, device, and method for determining to send a refresh command to a memory module according to a refresh rate and incrementing a postponed refresh count while the memory module is in an active mode in response to the determining to send the refresh command. The refresh command is not sent to the memory module when the postponed refresh count is incremented. A determination is made as to whether the postponed refresh count exceeds a count threshold. A refresh command is issued to the memory module to perform refresh in an active mode in response to determining that the postponed refresh count exceeds the count threshold.

25 Claims, 4 Drawing Sheets

(56) References Cited

OTHER PUBLICATIONS

Hurang, H., K.G. Shin, C. LeFurgy, and T. Keller, "Improving Energy Efficiency by Making DRAM Less Randomly Accessed", Proceedings of the 2005 International Symposium on Low Power Electronics and Design, 2005, 6 pp.

Hur, I. and C. Lin, "A Comprehensive Approach to DRAM Power Management", Proceedings of the 14th IEEE, International Symposium on High Performance Computer Architecture, 2008, 12 pp.

JEDEC Solid State Technology Association, "Double Data Rate (DDR) SDRAM Specification", JEDEC Standard, JESD79C, Mar. 2003, 82 pp.

LeBeck, A.R., X. Fan, H. Zeng, and C. Ellis, "Power Aware Page Allocation", Proceedings of the Ninth International Conference on Architectural Support for Programming Languages and Operating Systems, 2000, 12 pp.

Liu, S., P. Pattabiraman, T. Moscibroda, and B.G. Zorn, "Flikker: Saving DRAM Refresh-Power Through Critical Data Partitioning", Proceedings of the Sixteenth International Conference on Architectural Support for Programming Languages and Operating Systems, 2011, 12 pp.

Liu, J., B. Jaiyen, R. Veras, and O. Mutlu, "RAIDR: Retention-Aware Intelligent DRAM Refresh", Proceedings of the 39th Annual International Symposium on Computer Architecture, 2012, 12 pp.

Micron Technology, Inc., "Mobile DRAM Power-Saving Features and Power Calculations", Technical Note, 2005, 10 pp.

Minas, L. and B. Ellison, "The Problem of Power Consumption in Servers", [online], Mar. 5, 2009, [Retrieved on Nov. 10, 2013], retrieved from the Internet at <URL: http://www.drdobbs.com/the-problem-of-power-consumption-in-serv/215800830>, 8 pp.

Pandey, V., W. Jiang, Y. Zhou, and R. Bianchini, "DMA-Aware Memory Energy Management", Proceedings of HPCA, 2006, 12 pp.

Stuecheli, J., D. Kaseridis, H.C. Hunter, and L.K. John, "Elastic Refresh: Techniques to Mitigate Refresh Penalties in High Density Memory", Proceedings of the 43rd Annual IEEE/ACM International Symposium on Microarchitecture, 2010, 10 pp.

Venkatesan, R.K., S. Herr, and E. Rotenberg, "Retention-Aware Placement in DRAM (RAPID): Software Methods for Quasi-Non-Volatile DRAM", Proceedings of the Twelfth International Symposium on High-Performance Computer Architecture, 2006, 11 pp.

Wikipedia, "Dynamic Random-Access Memory", [online], last modified Oct. 14, 2013, [Retrieved Oct. 14, 2013], retrieved from the Internet at <URL: http://en.wikipedia.org/w/index.php?title=Dynamic_random-access_memory&oldid=577138852>, 16 pp.

Bhati, Chishti, and Jacob, "Coordinated Refresh: Energy Efficient Techniques for DRAM Refresh Scheduling", Int'l Symposium on Low Power Electronics & Design, Sep. 16, 2013, 6 pp.

* cited by examiner

| Pattern Name | Previous (n=3) IDLE period ranges | | | HMAP Prediction |
|---|---|---|---|---|
| | Prev_3 | Prev_2 | Prev_1 | |
| *Pattern1* | * | H | H | H |
| *Pattern2* | L/M | H | L/M | H |
| *Pattern3* | * | M | M | M |
| *Pattern4* | Others | | | L |

FIG. 7

COORDINATING POWER MODE SWITCHING AND REFRESH OPERATIONS IN A MEMORY DEVICE

TECHNICAL FIELD

Embodiments described herein generally relate coordinating power mode switching and refresh operations in a memory device.

BACKGROUND

A memory controller manages the flow of data between a processor and a one or more memory modules on an interface or bus. The memory controller contains the logic needed to read and write to a memory module and refresh the data stored in the memory device. The memory module may comprise a dynamic random access memory (DRAM) made up of a plurality of DRAM ranks A memory rank is a set of memory devices, i.e., dies, in the memory module connected to the same chip select, and which are therefore accessed simultaneously, and which may share all of the other command and control signals, wherein only the data pins for each DRAM module are separate. The memory controller supports a protocol used by multiple memory modules coupled to the channel, such as the Joint Electron Device Engineering Council (JEDEC) Double Data Rate Third Generation (DDR3) Synchronous Dynamic Random Access Memory (SDRAM) protocol.

As DRAM devices become faster and denser, they consume more energy, even when the memory system is not servicing any requests. The increase in device speed leads to higher background power dissipation by the peripheral circuitry, and the increase in device density results in higher refresh energy. For instance, it is projected that refresh operations utilize a substantial amount of DRAM power while simultaneously degrading DRAM throughput in future 64 Gb devices. These trends have caused the memory subsystem to become a major contributor of energy consumption in current and future computing platforms.

Commodity DRAM devices employ low power operating modes to reduce the background power consumed by the peripheral circuitry. Current DRAM devices have the following three operational modes: (1) Active, (2) Power-Down (PD), and (3) Self-refresh (SR). Active mode is the normal operating mode in which the rank can immediately service requests. In the PD mode, some Input/Output (I/O) signals and peripheral logic are disabled, resulting in lower power consumption.

In SR mode, the entire DRAM clocked circuitry and the delayed lock loop (DLL) are turned off. Therefore, no power is consumed except by refresh operations, which are triggered internally in the DRAM by a built-in timer. The DDR3 switching time from SR to active mode is specified as the maximum of the following two parameters: (i) $t_{RFC}$: the time required to service a refresh command, (ii) $t_{DLLK}$: the DLL lock period. The $t_{RFC}$ increases with the size of the DRAM device, whereas $t_{DLLK}$ remains constant (e.g. 512 clock cycles in DDR3 devices) irrespective of device size and speed.

In DDR devices, scheduling of refresh operations is dictated by two timing parameters. The first parameter, $t_{RFC}$, represents the time required to complete one refresh operation, and the second parameter, $t_{REFI}$, specifies the average time period between two refresh operations. The value of $t_{RFC}$ depends upon the number of rows refreshed with one refresh operation, whereas $t_{REFI}$ depends on $t_{RFC}$ and the total number of rows to be refreshed. As device density increases, we either have to refresh more rows per refresh operation (increase $t_{RFC}$) or service refreshes more frequently (decrease $t_{REFI}$). DDR3 devices are specified to keep $t_{REFI}$ constant at 7.8 μs. Consequently, $t_{RFC}$ increases with increasing device density.

When the memory controller issues a refresh command (also called Auto-refresh) to a memory rank, each memory module in that rank simultaneously starts to refresh. Therefore the entire rank becomes unavailable to service any memory requests for $t_{RFC}$ period. Furthermore, auto-refresh commands can only be issued when the rank is in active mode. If the rank happens to be in PD mode, the memory controller must first transition it to the active mode, and then schedule an auto-refresh command. Consequently, while servicing auto-refreshes, DRAM devices not only consume refresh power but also high background power.

The most prevalent refresh approach in current-day memory controllers is Demand Refresh (DR), in which an auto-refresh command is issued immediately after every $t_{REFI}$ time period. However, DR does not address the increasing refresh penalty in high density devices. Recently proposed Elastic Refresh postpones up to eight refresh commands during a high memory activity phase, and then compensates by servicing those pending refreshes during a subsequent idle memory phase. To satisfy the average refresh rate constraint specified by $t_{REFI}$, pending refreshes have to be issued at a rate faster than $1/t_{REFI}$. The Elastic Refresh memory controller satisfies this constraint by adjusting the auto-refresh command issue rate based on the number of pending refreshes. If the number of pending refreshes is high, auto-refresh commands are issued at a faster rate, and vice versa. Therefore, by scheduling most of the refreshes during idle periods, Elastic Replenish can mitigate the performance impact of refreshes.

BRIEF DESCRIPTION OF THE DRAWINGS

Embodiments are described by way of example, with reference to the accompanying drawings, which are not drawn to scale, in which like reference numerals refer to similar elements.

FIG. 7 illustrates an embodiment of predictive idle period length outcomes for previous idle period lengths.

DESCRIPTION OF EMBODIMENTS

Figure 1:
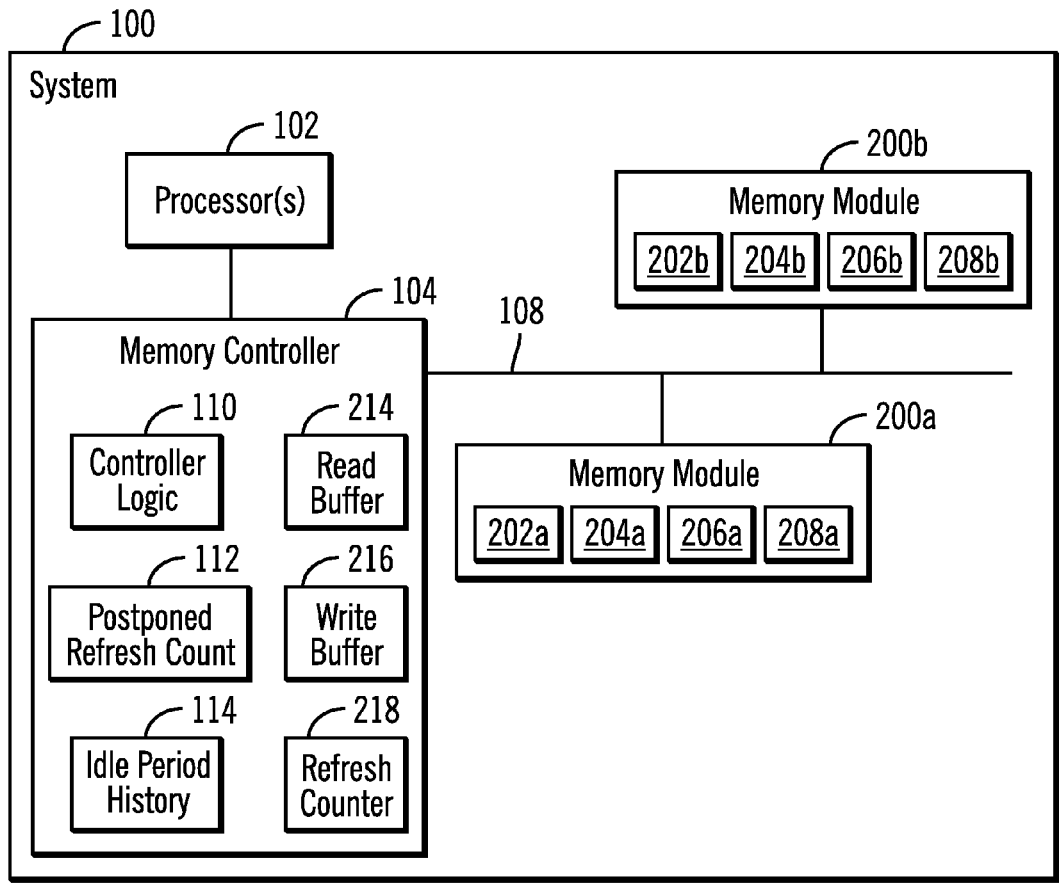
FIG. 1 illustrates an embodiment of a system having a memory system.

Although idle period tracking can be leveraged to implement both intelligent low power mode switching and intelligent refresh scheduling, these two sets of techniques are in conflict with each other and often render each other ineffective. For example, if a memory controller using Elastic Refresh issues a batch of pending refresh commands immediately after the DRAM becomes idle, then the DRAM would need to be kept in the highest power active mode until all the pending refreshes have been completed, thereby limiting the effectiveness of low power mode switching. Elastic Refresh techniques mitigate only the performance impact of refreshes and do not address the background power consumption during refresh operations. Conversely, if the rank is immediately switched to self-refresh mode upon becoming idle, then Elastic Refresh would be unable to service any pending refreshes, thereby rendering Elastic Refresh scheme ineffective.

Described embodiments provide techniques to coordinate the scheduling of refresh operations in active mode and low power mode switching to self-refresh mode so that the required refreshes are scheduled when the memory module is at in the self-refresh mode, which may be the lowest power mode. Further, described embodiments seek to schedule a self-refresh mode for the memory module which may include additional refresh operations to increase the number of internal refreshes during predicted longer idle periods and when the postponed number of refreshes is relatively high.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other. Certain embodiments relate to memory devices electronic assemblies. Embodiments include both devices and methods for forming electronic assemblies.

FIG. 1 illustrates an embodiment of a computing system 100 including one or more processors 102, a memory controller 104 and multiple memory modules 200a, 200b, which are typically mounted on a motherboard. The processors 102 may comprise a central processing unit, multi-core processor. The memory controller 104, in response to memory access requests from the processors 102, communicates with multiple memory modules 200a, 200b over a bus 108, also referred to as a channel, bus interface, etc., where both memory modules 200a, 200b are separately and independently connected to the same bus 108. The memory controller 104 may include controller logic 110 comprising the code or logic executed to perform operations; a postponed refresh count 112 indicating a number of scheduled refresh operations, e.g., auto-refreshes, that have been postponed while the memory module 200a, 200b is in an active mode; and an idle period history 114 providing idle period lengths for a plurality of previous idle periods that are used to predict the idle period length of a current idle period. When the memory modules 200a, 200b are in self-refresh (SR) mode, the controller logic 110 decrements the postponed refresh count 112 when the controller logic 110 calculates that the memory modules 200a, 200b have performed a refresh based on the specified timing for refreshes by the memory modules 200a, 200b in self-refresh mode.

In the embodiment of FIG. 1, the memory modules 200a, 200b are mounted in slots or memory sockets on the system 100 motherboard. The memory modules 200a, 200b may comprise the same or different types of memory modules that have a pin arrangement compatible with the pin arrangement in the memory slots on the motherboard. Further, the memory modules may support the same or different memory protocols, such as Double Data Rate Third Generation (DDR3) protocol and additional protocols. Although only two memory modules 200a, 200b are shown, there may be multiple memory modules Each of the memory modules 200a, 200b include memory chips 202a, 204a, 206a, 208a and 202b, 204b, 206b, 208b, respectively, on one or both sides of the memory module 200a, 200b, to store the data. The memory chips, e.g., DRAM chips, dies, devices, located on one or both sides of the memory module package 200a, 200b, comprise the storage elements that store data being used by the processor 102.

The memory controller 104 includes logic, such as logic 110, to manage read training operations, read and write operations, and memory management operations with respect to the memory modules 200a, 200b connected to the bus 108, and interface the processor 2 to the memory modules 200a, 200b. The memory controller 104 may further include a read buffer 214 and a write buffer 216 to buffer read and write data for the memory modules 200a, 200b. The memory controller 104 and/or the memory modules 200a, 200b may be integrated with the processor 102 or implemented in logic separate from the processor 102 on the system 100 motherboard as shown in FIG. 1.

The system 100 motherboard may include a memory socket compatible with different types of memory chips, to allow different types of memory modules 200a, 200b supporting different types of memory devices supporting different memory protocols as long as the different types of memory modules 200a,200b are compatible with the pin architecture in the memory sockets.

In one embodiment, the memory modules 200a, 200b may comprise a same or different type of Double data rate synchronous dynamic random-access memory (DDR SDRAM) memory module, such as LPDDRs, Dual In-Line Memory Modules (DIMMs), such as unbuffered DIMMs (UDIMM), Load Reduced Dual-inline Memory Module (LRDIMM), a Small Outline Dual In-line Memory Module (SODIMM), etc.

Figure 2:
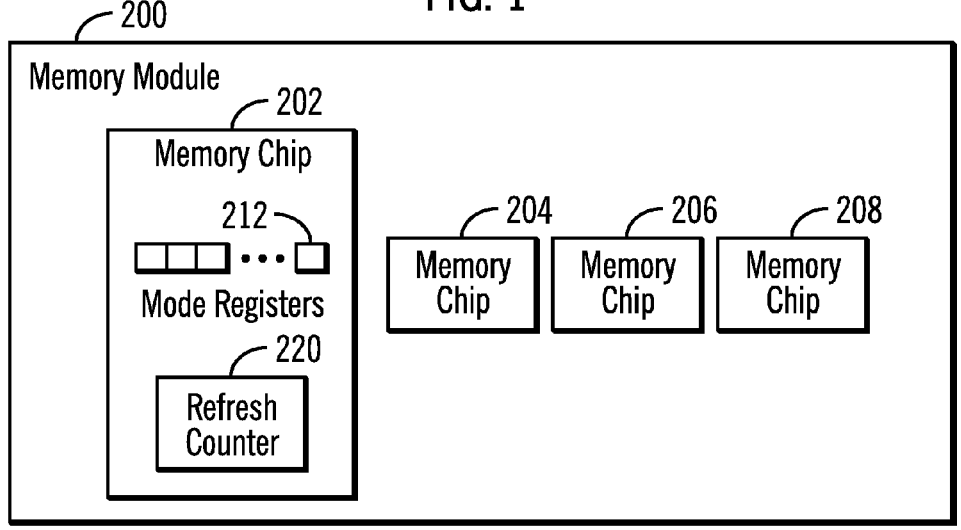
FIG. 2 illustrates an embodiment of a memory module.

FIG. 2 provides further details of an embodiment of a memory module 200, such as the memory modules 200a, 200b. The module 200 includes memory chips 202, 204, 206, 208 organized in one or more memory ranks A memory chip, such as memory chip 202 in the memory module 200 may include mode registers 212 having data which may be configured using a Mode Register Set (MRS) command and a refresh counter 220 indicating a number of refreshes programmed by the memory controller 104 for the memory module 200 to initiate immediately in the SR mode. A refresh counter 220 indicates a number of advance refreshes for the memory module 200 to perform, and may be decremented for each refresh issued and reset when the self-refresh mode exits. Certain embodiments of the memory module 200 may not implement the refresh counter 220 and may include additional logic to immediately initiate refreshes indicated by the memory controller 104 in self-refresh mode.

Memory chips 202, 204, 206, and 208 that are part of the same rank will receive the same commands over the same command bus, so that when the memory controller 104 specifies to refresh a rank, all memory chips 202, 204, 206, and 208 in that rank receive that same refresh or mode change command. The memory module 200 further includes sufficient logic to interact and process the commands from the memory controller 104.

The code or logic implementing the memory controller 104 operations may be implemented as computer readable code loaded into a memory and executed by a processor or may be encoded in hardware logic, such as in an Application Specific Integrated Circuit (ASIC), Field Programmable Gate Array (FPGA), etc.

The logic or code of the described embodiments may be implemented in a machine-readable storage medium comprising in a device or apparatus having electrical and other hardware elements for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, and other machine-readable media suitable for storing electronic instructions.

In alternative implementations, the logic or code of the described embodiments may be implemented in a signal transmission medium.

Figure 3:
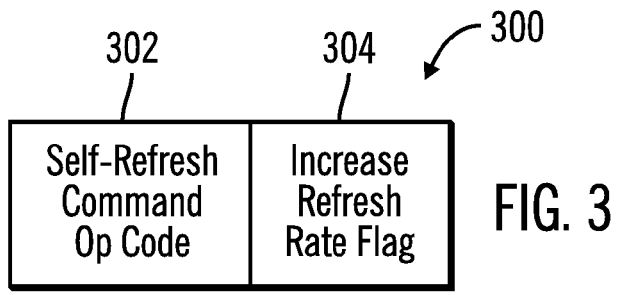
FIGS. 3 and 4 illustrate embodiments of self-refresh commands.

FIG. 3 illustrates a first embodiment of a self-refresh command 300 the memory controller 104 may send to the memory module 200 including a refresh command operation code 302 and an increase refresh rate flag 304 which indicates whether the memory module should increase the rate at which it performs self-refresh operations, such as double the refresh rate from a normal refresh rate. This increased rate for the self-refresh operations may also be independently used to increase the refresh rate when the temperature of the memory module is high.

In an alternative embodiment, the self-refresh command 302 may not include the increase refresh rate flag 304 and the memory controller 104 may send the memory module 200 a command prior to the self-refresh command 302 indicating to increase the refresh rate so that when the memory module 200 transitions to self-refresh mode it will self-refresh at a normal or increased refresh rate. In a still further embodiment, the memory controller 104 may send the memory module 200 a high temperature flag prior to sending the self-refresh command, which causes the memory module 200 to refresh at a higher rate. This embodiment utilizes the high temperature indicator in the DRAM specification to cause higher refresh rate during self-refresh mode even if the temperature is not high for the purpose of having the memory module 200 refresh at a higher rate to expedite execution of postponed refreshes indicated in the postponed refresh count 112 counter.

Figure 4:
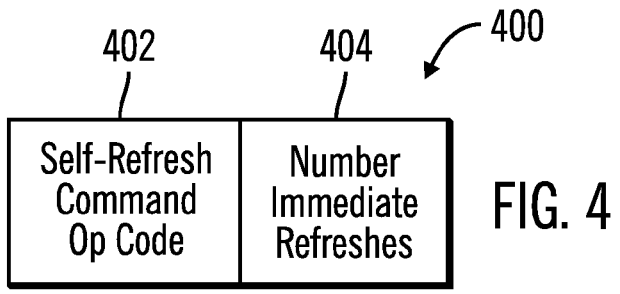

FIG. 4 illustrates a second embodiment of a self-refresh command 400 the memory controller 104 may send to a memory module 200 including a refresh command operation code 402 and a number of immediate refreshes 404 for the memory module to perform before entering the self-refresh mode where refresh operations are scheduled internally.

Described embodiments provide techniques to coordinate refreshes in self-refresh mode. The memory controller 104 postpones refreshes in active mode to avoid interrupting the memory module 200 operations. In one embodiment, if there are postponed refreshes, as indicated in the postponed refresh count 112, then to perform the postponed refreshes, the memory controller 104 may send advanced refresh operations, up to a maximum number of refresh operations that may be postponed, to the memory module 200 to perform before entering the self-refresh mode. In a further embodiment, the memory controller 104 may send the refresh command 400 that indicates that the memory module 200 should enter a high self-refresh rate, such as double, to increase the rate at which the memory module 200 internally self-refreshes. In a yet further embodiment, the memory controller 104 may include in the self-refresh command 400 a number of immediate refresh 404 operations for the memory module 200 to perform before initiating the self-refresh mode refresh operations.

Figure 5:
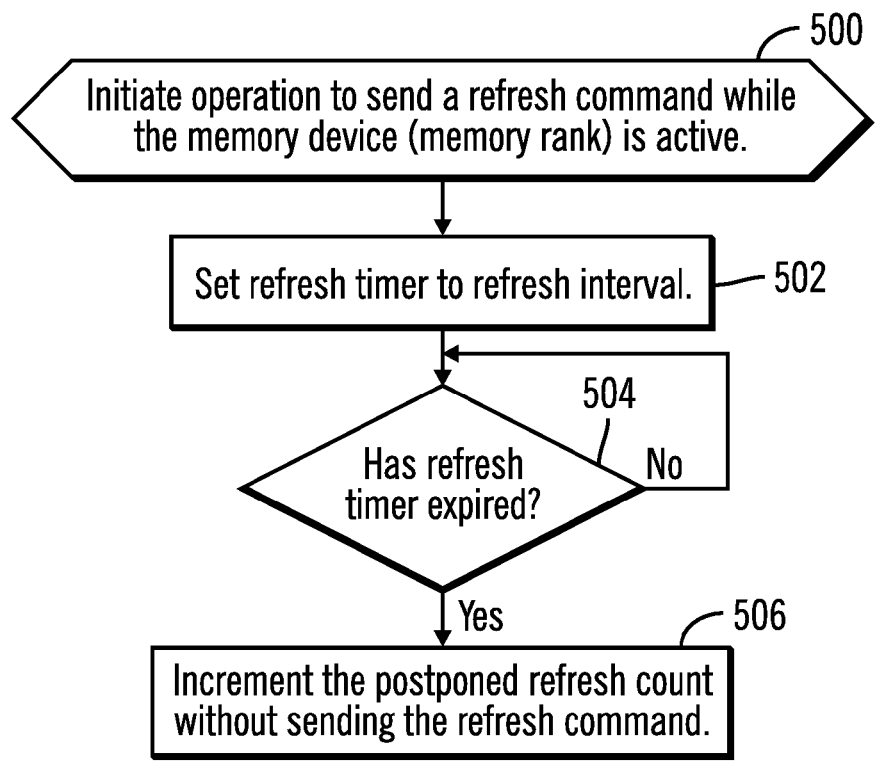
FIG. 5 illustrates an embodiment to generate a refresh for a memory device.

FIG. 5 illustrates an embodiment of operations performed by the memory controller 104 to refresh the memory module 200. Upon initiating (at block 500) refresh operations, the memory controller 104 sets (at block 502) a refresh timer to the refresh interval $t_{REFI}$. When (at block 504) the refresh time has expired, then the memory controller 104 increments (at block 506) the postponed refresh count 112 without sending the refresh command. In this way, during active mode, the memory module's 200 I/O servicing operations are not interrupted to perform a refresh operation, thus improving performance of the memory device.

Figure 6:
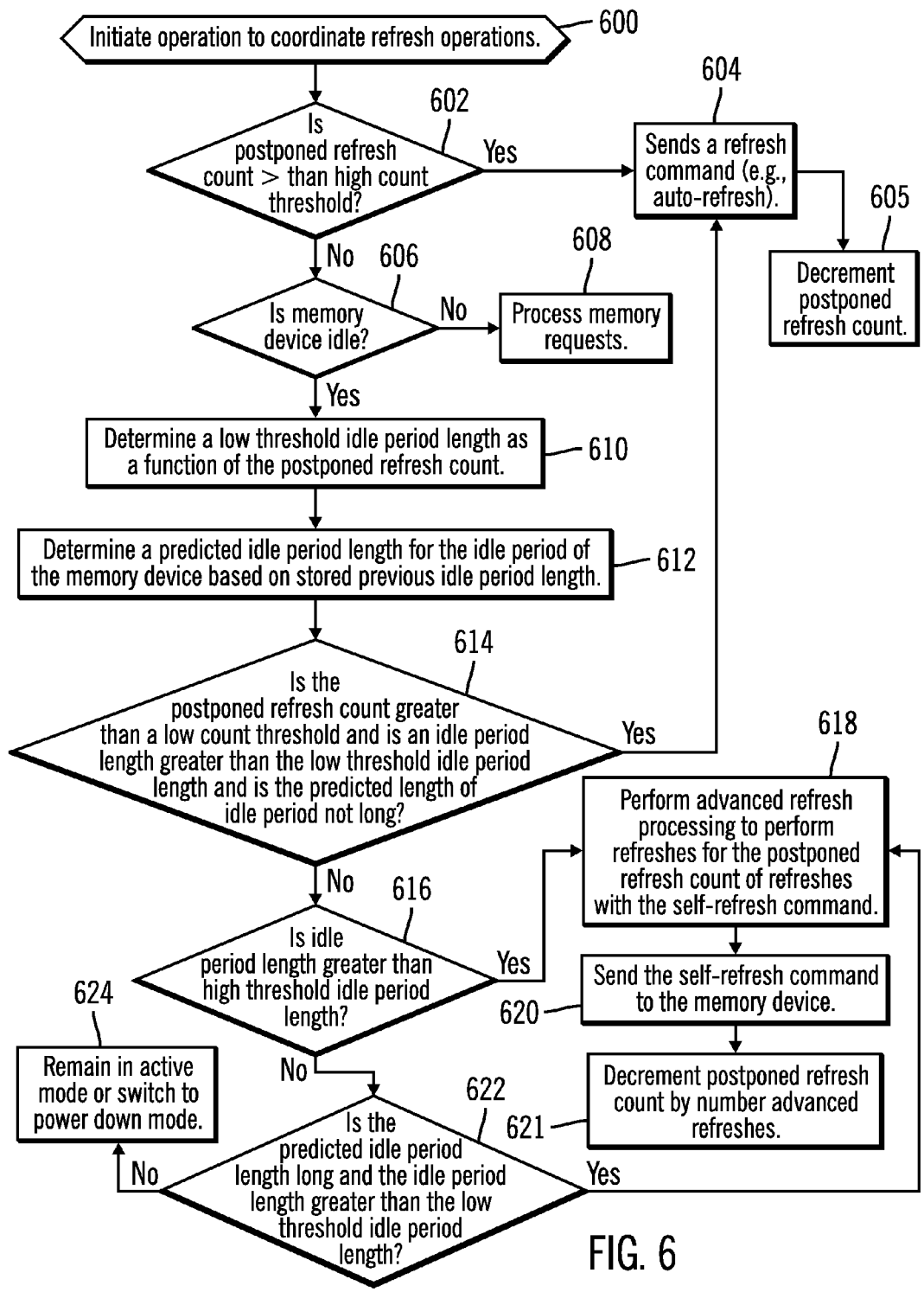
FIG. 6 illustrates an embodiment of operations to coordinate refresh operations.

FIG. 6 illustrates an embodiment of operations performed by the memory controller 104 to coordinate auto-refresh and self-refresh operations at the memory device. The operations of FIG. 6 may be initiated after processing the expiration of a refresh $t_{REFI}$ when a refresh operation is postponed or in response to another event. If (at block 602) the postponed refresh count is greater than a high postponed count threshold, which may comprise a maximum number of allowable postponed refreshes, then the memory controller 104 sends (at block 604) a refresh command to the memory device, such as an auto-refresh command, while the memory module is in active mode. Although this will disrupt memory module 200 I/O servicing, at this point it is necessary because the maximum number of refresh operations have been postponed.

If (at block 602) the postponed refresh count 112 is less than the high or maximum postponed count threshold, then if (at block 606) the memory module is not idle, control proceeds to process (at block 608) any received memory module requests 608. If (at block 606) the memory module 200 is idle, then the memory controller 104 proceeds to block 610 et seq. to perform processing to determine whether to issue proactive refresh requests, e.g., auto-refresh, or enter self-refresh mode in which power will be conserved and the memory module 200 will refresh automatically.

At block 610, the memory controller 104 determines (at block 610) a low threshold idle period length as a function of the postponed refresh count 112. For instance, the low threshold idle period length may decrease as the postponed refresh count 112 increases to require a shorter idle period length before refreshing as the number of postponed refreshes increases.

The memory controller 104 determines (at block 612) a predicted idle period length for the current idle period of the memory module based on the stored previous idle period history 114 of previous idle period lengths. In one embodiment the previous idle periods stored in the history 114 may be analyzed to determine a pattern to categorize the predicted idle period length of the current idle period as high, medium or low corresponding to idle period lengths of long, medium or short.

FIG. 7 illustrates an example of how three previous idle period length value categorizations of high, medium or low may be used to predict the current predicted idle period length. In one embodiment, the memory controller 104 may categorize previous idle periods in ranges, based on period lengths. The number of previous idle periods stored for history (n) and the number of levels used for idle period ranges (m) are controlled by configurable parameters for a DRAM rank. In one example embodiment, the number of idle period categorization ranges comprises m=3 for three (n=3) history values, such that the categorized idle period lengths may be assigned: Low (0 to $0.67*t_{REFI}$), Medium ($0.67*t_{REFI}$ to $1.5*t_{REFI}$) and High (longer than $1.5*t_{REFI}$).

In the example of FIG. 7, a high (or long) idle period is predicted if an alternating idle period pattern is captured when a sequence of Low, High, and Low is seen and if a stable long idle period is predicted after observing previous two High periods. In certain embodiments, the predicted idle period length may be considered long if the high categorization is made and not long if the medium or low categorizations are made.

At block 614, the memory controller 104 may consider whether to initiate a refresh at the memory module 200 depending on the number of postponed refreshes indicated in the counter 112, the current idle period length, and/or the predicted length of the idle period. In one embodiment, if (at block 614) all the three conditions are satisfied that: (1) the postponed refresh count is greater than a low count threshold; (2) the idle period length is greater than the low threshold idle period length, determined at block 610, and (3) the predicted length of idle period of length is not long, then the refresh command is sent 604. In this way, if the current idle period is predicted to be short and its length is greater than a low threshold and the postponed refresh count 122 although not the maximum exceeds a certain value indicating that the postponed refreshes are getting high, then the memory controller 104 sends the refresh command to reduce the number of postponed refreshes. The postponed refresh count 112 may be decremented (at block 605) upon sending the refresh at block 604. In alternative embodiments, the refresh may be sent if any combination or number of the factors (1), (2), and (3) are considered. In this way, the cost of switching from an active mode to self-refresh mode is avoided for predicted idle period lengths that are not high and would not persist long enough to experience the power saving benefits of self-refresh mode.

If (at block 614) the three (or fewer) considered factors do not indicate a refresh is needed, such as if the idle period is not predicted to be short, then a determination is made (at block 616) as to whether the idle period length exceeds a high threshold, indicating the memory module has been idle for a relatively long period. If so, then the memory controller 104 performs (at block 618) advanced refresh processing to perform refreshes for the number of postponed refresh count 112 with the self-refresh command. The self-refresh command is sent (at block 620) to the memory device.

In one embodiment, the advanced refresh processing may be implemented by sending an advanced refresh command to cause the memory module 200 to perform an indicated number of immediate refresh operations before entering the self-refresh mode. In a further embodiment, the self-refresh command 300 of FIG. 3 may be sent that indicates the increased refresh rate 304 to cause the memory module 200 to self-refresh at a higher rate to offset the number of postponed refreshes. In a yet further embodiment, the refresh command 400 of FIG. 4 may be sent which indicates a number of immediate refreshes 404 for the memory module 200 to perform before self-refresh mode refreshes are performed.

Upon performing advanced refresh processing, the memory controller 104 may decrement (at block 621) the postponed refresh count 112 by the number of advanced refreshes.

If (at block 622) the idle period length is between the high and low thresholds and the predicted idle period length is long, then control proceeds to block 618 to enter self-refresh mode. In this way, although the current idle period may not be high, if the predicted length of the idle period is in fact high, then self-refresh mode is entered to take advantage of the power savings from being in self-refresh mode for a long idle period. Otherwise, if (at block 622) the predicted idle period length is not long or the idle period length is not between the low and high thresholds, which means it is below the low threshold and in a short idle period, then the memory module remains in active mode or may switch to a power down mode.

In further embodiments, during self-refresh mode, the memory controller 104 may maintain a timer to estimate the number of self-refreshes performed by the memory module 200 and decrement the postponed refresh count 112 by the number of estimated refreshes performed by the memory module 200 during self-refresh mode. If the memory module 200 was operating at an advanced refresh rate, such as a higher refresh rate or performing advanced refreshes, and the memory controller 104 determines that the postponed refresh count 112 goes to zero, then the memory controller 104 may send a command to the memory module 200 to have it transition out of self-refresh mode to then receive instructions to lower its refresh rate or clear the refresh counter 218 to return the memory module 200 to processing refreshes at a normal rate. After sending this command to return to normal refresh rate processing, the memory controller 104 may then send a self-refresh command to return the memory module 200 to self-refresh mode to refresh at the reduced normal rate.

Described embodiments provide techniques to balance the need to refresh the memory module and save power by entering self-refresh mode with the need to limit refresh operations that interrupt I/O to the memory module and avoid transitioning to self-refresh mode for short periods when the idle period length is short. Described embodiments balance these costs and benefits of refresh and self-refresh mode by coordinating refresh operations during active mode and entering into self-refresh mode by considering a duration of a current idle period, a predicted idle period length of the current idle period, and a number of postponed refreshes. For long idle periods, described embodiments tend to switch to self-refresh mode before servicing the pending refreshes. Further, for long idle periods, described embodiments may issue advance refreshes up to a maximum number of postponed refreshes to carry out refreshes in advance in anticipation of a future high activity period. Yet further, with described embodiments, for relatively short idle periods, refreshes are performed in active mode to avoid performance penalties of switching from self-refresh to active mode. Still further, when there are no idle periods, refreshes in active mode are still issued to prevent the number of postponed refreshes from exceeding a maximum number of postponed refreshes. In this way, described embodiments postpone refreshes in a high activity phase and determine an appropriate idle period for refreshing in active mode and switching to self-refresh mode to save power and have the memory module internally initiate refreshes to reduce the postponed refresh count.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

The described operations of the memory controller 104 and the memory modules 200 may be implemented as a method, apparatus or computer readable storage medium using standard programming and/or engineering techniques to produce software, firmware, hardware, or any combination thereof. The described operations may be implemented as code or logic maintained in a "computer readable storage medium", which may directly execute the functions or where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The computer readable storage medium may further comprise digital logic implemented in a hardware device (e.g., an integrated circuit chip, a programmable logic device, a Programmable Gate Array (PGA), field-programmable gate array (FPGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmission signals. Those skilled in the art will recognize that many modifications may be made to this configuration without departing from the scope of the present invention, and that the article of manufacture may comprise suitable information bearing medium known in the art.

EXAMPLES

The following examples pertain to further embodiments.

Example 1 is a memory system comprising: a memory module; a bus interface to the memory module; a memory controller coupled to the bus interface to communicate with the memory module and including logic that when operates performs operations, the operations comprising: determining to send a refresh command according to a refresh rate; incrementing a postponed refresh count while the memory module is in an active mode in response to the determining to send the refresh command, wherein the refresh command is not sent to the memory module when the postponed refresh count is incremented; determining whether the postponed refresh count exceeds a count threshold; and issuing a refresh command to the memory module to perform refresh in an active mode in response to determining that the postponed refresh count exceeds the count threshold.

In Example 2, the subject matter of Example 1 and 3-11 can optionally include that the operations further comprise: sending a self-refresh command to the memory module to enter a self-refresh mode in which the memory module internally performs refresh operations in response to an idle period length of an idle period of the memory module being greater than a threshold idle period length.

In Example 3, the subject matter of Examples 1-2 and 4-11 can optionally include that the operations further comprise: determining a number of advance refreshes based on the postponed refresh count; and sending the number of advance refreshes to the memory module prior to sending the self-refresh command to cause the memory module to perform the number of advanced refreshes prior to entering into self-refresh mode.

In Example 4, the subject matter of Examples 1-3 can optionally include that the operations further comprise: sending indication to the memory module to self-refresh at a higher self-refresh rate than a normal self-refresh rate based on the postponed refresh count.

In Example 5, the subject matter of Examples 1-4 and 6-11 can optionally include that the operations further comprise determining a number of immediate refreshes based on the postponed refresh count, wherein the self-refresh command indicates the number of immediate refreshes for the memory module to perform in addition to normal periodic self-refresh operations.

In Example 6, the subject matter of Examples 1-5 and 7-11 can optionally include that the operations further comprise: predicting a predicted idle period length of the idle period for the memory module as being long or not long; and sending the self-refresh command to the memory module in response to the predicted idle period length being long and the idle period length being greater than the threshold idle period.

In Example 7, the subject matter of Examples 1-6 and 8-11 can optionally include that the operations further comprise: predicting a predicted idle period length of an idle period for the memory module as being long or not long; and sending a refresh command to the memory module to perform a refresh operation while in the active mode in response to an idle period length of the idle period of the memory module being greater than a threshold idle period length and the prediction of the idle period being not long.

In Example 8, the subject matter of Examples 1-7 and 9-11 can optionally include that the threshold idle period length is a function of the postponed refresh count.

In Example 9, the subject matter of Examples 1-8 and 10-11 can optionally include that the count threshold comprises a high count threshold, and wherein when the postponed refresh count does not exceed the first count threshold, the operations further comprise: determining whether the postponed refresh count exceeds a low count threshold less than the high count threshold, wherein the refresh command is sent in response to the idle period length being greater than the threshold idle period length, the predicted idle period length being not long, and the postponed refresh count exceeding the low count threshold.

In Example 10, the subject matter of Examples 1-9 and 11 can optionally include that the threshold idle period length comprises a low threshold idle period, wherein a high threshold idle period length is greater than the low threshold idle period length, and wherein the operations further comprise: sending a self-refresh command to the memory module to enter a self-refresh mode in which the memory module internally performs refresh operations in response to the predicted idle period length being long and in response to the an idle period length being greater than the high threshold idle period length.

In Example 11, the subject matter of Examples 1-10 can optionally include that the postponed refresh count does not exceed the threshold, the operations further comprise: storing a plurality of idle period lengths for previous idle periods of the memory device; predicting an idle period length for the idle period of the memory module based on the stored previous idle period lengths; and using the predicted idle period length and a current idle period length of the memory module to determine whether to send one of a refresh command to refresh the memory module in active mode and a self-refresh command to cause the memory module to enter a self-refresh mode where the memory module internally performs refresh operations.

Example 12 is a device coupled to a memory module, comprising: memory controller logic that when operates performs operations, the operations comprising: determining to send a refresh command according to a refresh rate; incrementing a postponed refresh count while the memory module is in an active mode in response to the determining to send the refresh command, wherein the refresh command is not sent to the memory module when the postponed refresh count is incremented; determining whether the postponed refresh count exceeds a count threshold; and issuing a refresh command to the memory module to perform refresh in an active mode in response to determining that the postponed refresh count exceeds the count threshold.

In Example 13, the subject matter of Examples 12 and 14-18 can optionally include operations that further comprise sending a self-refresh command to the memory module to enter a self-refresh mode in which the memory module internally performs refresh operations in response to an idle period length of an idle period of the memory module being greater than a threshold idle period length.

In Example 14, the subject matter of Examples 12-13 and 15-18 can optionally include operations that further comprise: determining a number of advance refreshes based on the postponed refresh count; and sending the number of advance refreshes to the memory module prior to sending the self-refresh command to cause the memory module to perform the number of advanced refreshes prior to entering into self-refresh mode.

In Example 15, the subject matter of Examples 12-14 and 16-18 can optionally include operations that further comprise sending indication to the memory module to self-refresh at a higher self-refresh rate than a normal self-refresh rate based on the postponed refresh count.

In Example 16, the subject matter of Examples 12-15 and 17-18 can optionally include operations that further comprise: predicting a predicted idle period length of an idle period for the memory module as being long or not long; and sending a refresh command to the memory module to perform a refresh operation while in the active mode in response to an idle period length of the idle period of the memory module being greater than a threshold idle period length and the prediction of the idle period being not long.

In Example 17, the subject matter of Examples 12-16 and 18 can optionally include that the count threshold comprises a high count threshold, and wherein when the postponed refresh count does not exceed the first count threshold, the operations further comprise: determining whether the postponed refresh count exceeds a low count threshold less than the high count threshold, wherein the refresh command is sent in response to the idle period length being greater than the threshold idle period length, the predicted idle period length being not long, and the postponed refresh count exceeding the low count threshold.

In Example 18, the subject matter of Examples 12-17 can optionally include that the postponed refresh count does not exceed the threshold, and the operations further comprise: storing a plurality of idle period lengths for previous idle periods of the memory device; predicting an idle period length for the idle period of the memory module based on the stored previous idle period lengths; and using the predicted idle period length and a current idle period length of the memory module to determine whether to send one of a refresh command to refresh the memory module in active mode and a self-refresh command to cause the memory module to enter a self-refresh mode where the memory module internally performs refresh operations.

Example 19 comprises a method, comprising: determining to send a refresh command to a memory module according to a refresh rate; incrementing a postponed refresh count while the memory module is in an active mode in response to the determining to send the refresh command, wherein the refresh command is not sent to the memory module when the postponed refresh count is incremented; determining whether the postponed refresh count exceeds a count threshold; and issuing a refresh command to the memory module to perform refresh in an active mode in response to determining that the postponed refresh count exceeds the count threshold.

In Example 20, the subject matter of Examples 19 and 21-25 can optionally include sending a self-refresh command to the memory module to enter a self-refresh mode in which the memory module internally performs refresh operations in response to an idle period length of an idle period of the memory module being greater than a threshold idle period length.

In Example 21, the subject matter of Examples 19-20 and 22-25 can optionally include determining a number of advance refreshes based on the postponed refresh count; and sending the number of advance refreshes to the memory module prior to sending the self-refresh command to cause the memory module to perform the number of advanced refreshes prior to entering into self-refresh mode.

In Example 22, the subject matter of Examples 19-21 and 22-25 can optionally include sending indication to the memory module to self-refresh at a higher self-refresh rate than a normal self-refresh rate based on the postponed refresh count.

In Example 23, the subject matter of Examples 19-22 and 24-25 can optionally include predicting a predicted idle period length of an idle period for the memory module as being long or not long; and sending a refresh command to the memory module to perform a refresh operation while in the active mode in response to an idle period length of the idle period of the memory module being greater than a threshold idle period length and the prediction of the idle period being not long.

In Example 24, the subject matter of Examples 19-23 and 25 can optionally include that the count threshold comprises a high count threshold, and wherein when the postponed refresh count does not exceed the first count threshold, further comprising: determining whether the postponed refresh count exceeds a low count threshold less than the high count threshold, wherein the refresh command is sent in response to the idle period length being greater than the threshold idle period length, the predicted idle period length being not long, and the postponed refresh count exceeding the low count threshold.

In Example 25, the subject matter of Examples 19-24 can optionally include that the postponed refresh count does not exceed the threshold, further comprising: storing a plurality of idle period lengths for previous idle periods of the memory device; predicting an idle period length for the idle period of the memory module based on the stored previous idle period lengths; and using the predicted idle period length and a current idle period length of the memory module to determine whether to send one of a refresh command to refresh the memory module in active mode and a self-refresh command to cause the memory module to enter a self-refresh mode where the memory module internally performs refresh operations.

Example 26 is an apparatus coupled to a memory module, comprising: means for determining to send a refresh command to the memory module according to a refresh rate; means for incrementing a postponed refresh count while the memory module is in an active mode in response to the determining to send the refresh command, wherein the refresh command is not sent to the memory module when the postponed refresh count is incremented; means for determining whether the postponed refresh count exceeds a count threshold; and means for issuing a refresh command to the memory module to perform refresh in an active mode in response to determining that the postponed refresh count exceeds the count threshold.

In Example 27, the subject matter of Examples 26 and 28-29 can optionally include means for sending a self-refresh command to the memory module to enter a self-refresh mode in which the memory module internally performs refresh operations in response to an idle period length of an idle period of the memory module being greater than a threshold idle period length.

In Example 28, the subject matter of Examples 26-7 and 29 can optionally include means for determining a number of advance refreshes based on the postponed refresh count; and means for sending the number of advance refreshes to the memory module prior to sending the self-refresh command to cause the memory module to perform the number of advanced refreshes prior to entering into self-refresh mode.

In Example 29, the subject matter of Examples 26-28 can optionally include that the postponed refresh count does not exceed the threshold, further comprising: means for storing a plurality of idle period lengths for previous idle periods of the memory device; means for predicting an idle period length for the idle period of the memory module based on the stored previous idle period lengths; and means for using the predicted idle period length and a current idle period length of the memory module to determine whether to send one of a refresh command to refresh the memory module in active mode and a self-refresh command to cause the memory module to enter a self-refresh mode where the memory module internally performs refresh operations.

What is claimed:
1. A memory system comprising:
a memory module;
a bus interface to the memory module;
a memory controller coupled to the bus interface to communicate with the memory module and including logic that when operates performs operations, the operations comprising:
determining to send a refresh command according to a refresh rate;
incrementing a postponed refresh count while the memory module is in an active mode in response to the determining to send the refresh command, wherein the refresh command is not sent to the memory module when the postponed refresh count is incremented;
determining whether the postponed refresh count exceeds a count threshold; and
issuing a refresh command to the memory module to perform refresh in an active mode in response to determining that the postponed refresh count exceeds the count threshold.

2. The memory system of claim 1, wherein the operations further comprise:
sending a self-refresh command to the memory module to enter a self-refresh mode in which the memory module internally performs refresh operations in response to an idle period length of an idle period of the memory module being greater than a threshold idle period length.

3. The memory system of claim 2, wherein the operations further comprise:
determining a number of advance refreshes based on the postponed refresh count; and
sending the number of advance refreshes to the memory module prior to sending the self-refresh command to cause the memory module to perform the number of advanced refreshes prior to entering into self-refresh mode.

4. The memory system of claim 2, wherein the operations further comprise:
sending indication to the memory module to self-refresh at a higher self-refresh rate than a normal self-refresh rate based on the postponed refresh count.

5. The memory system of claim 2, wherein the operations further comprise
determining a number of immediate refreshes based on the postponed refresh count, wherein the self-refresh command indicates the number of immediate refreshes for the memory module to perform in addition to normal periodic self-refresh operations.

6. The memory system of claim 2, wherein the operations further comprise:
predicting a predicted idle period length of the idle period for the memory module as being long or not long; and
sending the self-refresh command to the memory module in response to the predicted idle period length being long and the idle period length being greater than the threshold idle period.

7. The memory system of claim 1, wherein the operations further comprise:
predicting a predicted idle period length of an idle period for the memory module as being long or not long; and
sending a refresh command to the memory module to perform a refresh operation while in the active mode in response to an idle period length of the idle period of the memory module being greater than a threshold idle period length and the prediction of the idle period being not long.

8. The memory system of claim 7, wherein when the threshold idle period length is a function of the postponed refresh count.

9. The memory system of claim 7, wherein the count threshold comprises a high count threshold, and wherein when the postponed refresh count does not exceed the first count threshold, the operations further comprise:
  determining whether the postponed refresh count exceeds a low count threshold less than the high count threshold, wherein the refresh command is sent in response to the idle period length being greater than the threshold idle period length, the predicted idle period length being not long, and the postponed refresh count exceeding the low count threshold.

10. The memory system of claim 9, wherein the threshold idle period length comprises a low threshold idle period, wherein a high threshold idle period length is greater than the low threshold idle period length, and wherein the operations further comprise:
  sending a self-refresh command to the memory module to enter a self-refresh mode in which the memory module internally performs refresh operations in response to the predicted idle period length being long and in response to the an idle period length being greater than the high threshold idle period length.

11. The memory system of claim 1, wherein when the postponed refresh count does not exceed the threshold, the operations further comprise:
  storing a plurality of idle period lengths for previous idle periods of the memory device;
  predicting an idle period length for the idle period of the memory module based on the stored previous idle period lengths; and
  using the predicted idle period length and a current idle period length of the memory module to determine whether to send one of a refresh command to refresh the memory module in active mode and a self-refresh command to cause the memory module to enter a self-refresh mode where the memory module internally performs refresh operations.

12. A device coupled to a memory module, comprising:
  memory controller logic that when operates performs operations, the operations comprising:
    determining to send a refresh command according to a refresh rate;
    incrementing a postponed refresh count while the memory module is in an active mode in response to the determining to send the refresh command, wherein the refresh command is not sent to the memory module when the postponed refresh count is incremented;
    determining whether the postponed refresh count exceeds a count threshold; and
    issuing a refresh command to the memory module to perform refresh in an active mode in response to determining that the postponed refresh count exceeds the count threshold.

13. The device of claim 12, wherein the operations further comprise:
  sending a self-refresh command to the memory module to enter a self-refresh mode in which the memory module internally performs refresh operations in response to an idle period length of an idle period of the memory module being greater than a threshold idle period length.

14. The device of claim 13, wherein the operations further comprise:
  determining a number of advance refreshes based on the postponed refresh count; and
  sending the number of advance refreshes to the memory module prior to sending the self-refresh command to cause the memory module to perform the number of advanced refreshes prior to entering into self-refresh mode.

15. The device of claim 13, wherein the operations further comprise:
  sending indication to the memory module to self-refresh at a higher self-refresh rate than a normal self-refresh rate based on the postponed refresh count.

16. The device of claim 12, wherein the operations further comprise:
  predicting a predicted idle period length of an idle period for the memory module as being long or not long; and
  sending a refresh command to the memory module to perform a refresh operation while in the active mode in response to an idle period length of the idle period of the memory module being greater than a threshold idle period length and the prediction of the idle period being not long.

17. The device of claim 16, wherein the count threshold comprises a high count threshold, and wherein when the postponed refresh count does not exceed the first count threshold, the operations further comprise:
  determining whether the postponed refresh count exceeds a low count threshold less than the high count threshold, wherein the refresh command is sent in response to the idle period length being greater than the threshold idle period length, the predicted idle period length being not long, and the postponed refresh count exceeding the low count threshold.

18. The device of claim 12, wherein when the postponed refresh count does not exceed the threshold, the operations further comprise:
  storing a plurality of idle period lengths for previous idle periods of the memory device;
  predicting an idle period length for the idle period of the memory module based on the stored previous idle period lengths; and
  using the predicted idle period length and a current idle period length of the memory module to determine whether to send one of a refresh command to refresh the memory module in active mode and a self-refresh command to cause the memory module to enter a self-refresh mode where the memory module internally performs refresh operations.

19. A method, comprising:
  determining to send a refresh command to a memory module according to a refresh rate;
  incrementing a postponed refresh count while the memory module is in an active mode in response to the determining to send the refresh command, wherein the refresh command is not sent to the memory module when the postponed refresh count is incremented;
  determining whether the postponed refresh count exceeds a count threshold; and
  issuing a refresh command to the memory module to perform refresh in an active mode in response to determining that the postponed refresh count exceeds the count threshold.

20. The method of claim 19, further comprising:
  sending a self-refresh command to the memory module to enter a self-refresh mode in which the memory module internally performs refresh operations in response to an idle period length of an idle period of the memory module being greater than a threshold idle period length.

21. The method of claim 20, further comprising:
  determining a number of advance refreshes based on the postponed refresh count; and sending the number of advance refreshes to the memory module prior to sending the self-refresh command to cause the memory module to perform the number of advanced refreshes prior to entering into self-refresh mode.

22. The method of claim 20, further comprising:
sending indication to the memory module to self-refresh at a higher self-refresh rate than a normal self-refresh rate based on the postponed refresh count.

23. The method of claim 19, further comprising:
predicting a predicted idle period length of an idle period for the memory module as being long or not long; and
sending a refresh command to the memory module to perform a refresh operation while in the active mode in response to an idle period length of the idle period of the memory module being greater than a threshold idle period length and the prediction of the idle period being not long.

24. The method of claim 23, wherein the count threshold comprises a high count threshold, and wherein when the postponed refresh count does not exceed the first count threshold, further comprising:
determining whether the postponed refresh count exceeds a low count threshold less than the high count threshold, wherein the refresh command is sent in response to the idle period length being greater than the threshold idle period length, the predicted idle period length being not long, and the postponed refresh count exceeding the low count threshold.

25. The method of claim 19, wherein when the postponed refresh count does not exceed the threshold, further comprising:
storing a plurality of idle period lengths for previous idle periods of the memory device;
predicting an idle period length for the idle period of the memory module based on the stored previous idle period lengths; and
using the predicted idle period length and a current idle period length of the memory module to determine whether to send one of a refresh command to refresh the memory module in active mode and a self-refresh command to cause the memory module to enter a self-refresh mode where the memory module internally performs refresh operations.

* * * * *